US006350697B1

United States Patent
Richardson et al.

(10) Patent No.: US 6,350,697 B1
(45) Date of Patent: Feb. 26, 2002

(54) METHOD OF CLEANING AND CONDITIONING PLASMA REACTION CHAMBER

(75) Inventors: Brett C. Richardson, San Ramon; Duane Outka, Fremont, both of CA (US)

(73) Assignee: LAM Research Corporation, Fremont, CA (US)

( * ) Notice: Subject to any disclaimer, the term of this patent is extended or adjusted under 35 U.S.C. 154(b) by 0 days.

(21) Appl. No.: 09/469,286

(22) Filed: Dec. 22, 1999

(51) Int. Cl.$^7$ ............................................. H01L 21/302
(52) U.S. Cl. ..................... 438/710; 438/725; 134/1.1
(58) Field of Search .................. 438/695, 696, 438/706, 710, 733, 720, 725; 134/1.1, 21, 22

(56) References Cited

U.S. PATENT DOCUMENTS

| | | | |
|---|---|---|---|
| 4,657,616 A | 4/1987 | Benzing et al. | 156/345 |
| 4,786,352 A | 11/1988 | Benzing | 156/345 |
| 4,816,113 A | 3/1989 | Yamazaki | 156/643 |
| 4,842,683 A | 6/1989 | Cheng et al. | 156/345 |
| 4,857,139 A | 8/1989 | Tashiro et al. | 156/643 |
| 5,006,192 A | 4/1991 | Deguchi | 156/345 |
| 5,129,958 A | 7/1992 | Nagashima et al. | 134/22.1 |
| 5,158,644 A | 10/1992 | Cheung et al. | 156/643 |
| 5,207,836 A | 5/1993 | Chang | 134/1 |
| 5,356,478 A | 10/1994 | Chen et al. | 134/1 |
| 5,639,341 A | 6/1997 | Tabara | 156/643.1 |
| 5,647,953 A | 7/1997 | Williams et al. | 156/643.1 |
| 5,756,400 A | * 5/1998 | Ye et al. | 438/710 |
| 5,817,574 A | * 10/1998 | Gardner | 438/637 |
| 5,877,032 A | * 3/1999 | Guinn et al. | 438/9 |
| 6,136,211 A | * 10/2000 | Qian et al. | 216/37 |
| 6,156,663 A | * 12/2000 | Watanabe et al. | 438/695 |

FOREIGN PATENT DOCUMENTS

| | | |
|---|---|---|
| EP | 0648858 A | 4/1995 |
| JP | 57-201016 | 9/1982 |
| JP | 61-250185 | 11/1986 |
| JP | 3-62520 | 3/1991 |

* cited by examiner

*Primary Examiner*—Benjamin L. Utech
*Assistant Examiner*—Kin-Chan Chen
(74) *Attorney, Agent, or Firm*—Burns, Doane, Swecker & Mathis, LLP (57) ABSTRACT

A method for cleaning and conditioning interior surfaces of a plasma chamber in which substrates such as silicon wafers are processed. The method includes cleaning the chamber such as by a wet clean or in-situ plasma clean, introducing a conditioning gas into the chamber, energizing the conditioning gas into a plasma state, depositing a polymer coating on the interior surfaces and processing a substrate. The conditioning step can be performed without a substrate such as a wafer in the chamber and the processing step can be carried out without running conditioning wafers through the chamber prior to processing production wafers. In the case of a plasma chamber used for etching aluminum, the conditioning gas can include a fluorine-containing gas, a carbon-containing gas and a chlorine-containing gas.

21 Claims, 5 Drawing Sheets

METHOD OF CLEANING AND CONDITIONING PLASMA REACTION CHAMBER

BACKGROUND OF THE INVENTION

During processing of semiconductor wafers it is conventional to carry out periodic in-situ cleaning of plasma etch and CVD reactors. U.S. Pat. No. 5,129,958 discloses a method for cleaning a CVD deposition chamber in a semiconductor wafer processing apparatus wherein fluorine residues in the chamber, left from a prior fluorine plasma cleaning step, are contacted with one or more reducing gases such as silane ($SiH_4$), ammonia, hydrogen, phosphine ($PH_3$), diborine ($B_2H_6$), and arsine ($AsH_3$). Another technique for cleaning and conditioning interior surfaces of plasma CVD reactors is disclosed in commonly owned U.S. Pat. No. 5,647,953, the subject matter of which is hereby incorporated by reference. In the past these cleans were done with a wafer in the chamber to cover the electrode, but it has become more common to do waterless cleans.

Other techniques for cleaning plasma reaction chambers are disclosed in commonly owned U.S. Pat. No. 5,356,478; in U.S. Pat. Nos. 4,657,616; 4,786,352; 4,816,113; 4,842,683, 4,857,139; 5,006,192; 5,129,958; 5,158,644 and 5,207,836 and Japanese Laid-Open Patent Publication Nos. 57-201016; 61-250185, 62-214175, 63-267430 and 3-62520. For instance, in order to remove $SiO_x$ deposits, a fluorine-containing gas energized into a plasma has been used to clean interior surfaces of the chamber. Fluorine residues remaining after the reactor cleaning can be removed by passing a reducing gas such as hydrogen ($H_2$), silane ($SiH_4$), ammonia ($NH_4$), phosphine ($PH_3$), biborine ($B_2H_6$) or arsine ($AsH_3$) through the reactor.

Chamber conditioning processes are also commonly used where a wafer is placed in the chamber to protect the electrode during conditioning. These conditioning processes are very common for deposition reactors following plasma cleans, and are also common for etch reactors following wet cleans. Sometimes the wafer has a deposited film on it which aids in the conditioning process. As an example, resist coated wafers have commonly been used to accelerate conditioning. Such conditioning steps may use process conditions without bottom electrode power to season the chamber walls.

A problem with using conditioning wafers season the plasma chamber to obtain reproducible process conditions when processing production wafers is that such conditioning wafers add cost and cause slowdown in production. Accordingly, it would be desirable for a conditioning treatment which is more economical in terms of cost and production efficients

SUMMARY OF THE INVENTION

This invention provides a method of cleaning and conditioning a plasma reaction chamber in which substrates are processed, comprising the steps of cleaning the plasma reaction chamber so as to remove deposits built up on surfaces within the chamber, introducing a conditioning gas comprising a fluorine-containing gas and a carbon-containing gas into the chamber, energizing the conditioning gas into a plasmastate, depositing a polymer coating on interior surfaces of the chamber, and processing a substrate in the chamber after the depositing step. The term "polymer" coating is intended to describe organic films which may contain etch or deposition by-products.

According to a preferred embodiment of the invention, the energizing step is carried out by exposing the conditioning gas to an inductive field generated by resonating a radio frequency current in an RF antenna coil, the RF antenna coil being disposed external to the chamber, proximate to a dielectric shield which forms a part of an enclosure of the chamber. Further, the cleaning step can be carried out by opening the chamber and performing a wet clean or the cleaning step can be carried out by introducing a cleaning gas into the chamber, energizing the cleaning gas into a plasma state, and contacting the interior surfaces with the plasma to remove the deposits. In the preferred method, the conditioning step is carried out while the chamber does not contain a substrate therein and/or the substrate comprises a production wafer and the processing step is carried out without processing conditioning wafers in the chamber prior to processing the production wafer. Also, the conditioning step can be carried out without applying power to an RF biasing electrode of a substrate support on which the substrate is supported during the processing step.

In cleaning an aluminum etch reactor, the conditioning gas can further comprise a chlorine-containing gas so that the polymer deposited in the depositing step will include chlorine therein and the processing step comprises etching an aluminum layer on the production wafer. In such a case, the conditioning gas can include $Cl_2$, $BCl_3$, $CCl_4SiCl_4$ or mixture thereof. For example, the conditioning step can be carried out in one or more steps using $CHF_3$, $BCl_3$ and/or $Cl_2$ as the conditioning gas. The chamber pressure during the conditioning step can be in the range of from about 5 to 80 mTorr and/or a plasma generating antenna can be supplied 200 to 1000 Watts during the conditioning step.

DETAILED DESCRIPTION OF THE PREFERRED EMBODIMENTS

This invention provides an economical method of cleaning and conditioning a plasma reaction chamber in which substrates are processed. The method includes cleaning the plasma reaction chamber so as to remove deposits built up on surfaces within the chamber, introducing a conditioning gas comprising a fluorine-containing gas and a carbon-containing gas into the chamber, energizing the conditioning gas into a plasma, depositing a polymer coating formed by the plasma on interior surfaces of the chamber, and processing a substrate in the chamber after the depositing step.

In a preferred embodiment, the invention provides a waferless plasma clean recovery process for conditioning chambers used for plasma etching an aluminum film stack. The process for plasma etching of Al produces a by-product which deposits throughout the reactor. Eventually this by-product reaches a thickness where it no longer sticks to the reactor wall and particles are shed which contaminate the substrate being etched. When this happens, the reactor must be opened and cleaned with a wet clean process.

The process of preparing a reactor for cleaning, along with the actual clean process and the steps required to condition the chamber following an open chamber clean can require a substantial amount of time. To maximize productivity in a wafer fab, it is desirable to extend the time between opening the chamber to do such open chamber cleans. One method for doing this has been to run plasma cleans, which are capable of reducing the etch by-product deposited in the chamber resulting in a extended time between open chamber cleans. However, since plasma cleans alter the chamber condition by removing the reactor deposits, there is typically a process shift following the plasma clean. As a result, the aluminum etch rate, etch profiles and feature CDs (critical dimension) can shift outside of the acceptable range for the device being manufactured. If a plasma clean is used, wafers are cycled through the chamber to recondition the walls prior to etching product wafers.

In processes wherein a wafer is needed in the chamber for conditioning, a special wafer type may also be needed. This limits the applicability of plasma clean processes for Al etching in a production environment because it would be disruptive to production flows to have to load special wafers into the chamber and run a conditioning process after a plasma clean. As a result, in production, plasma cleans would not be used and the reactors would need to be opened more frequently for long wet clean procedures. Thus, the reactor availability advantage of using plasma cleans to extend the wet clean time is negated by the burden of reconditioning the chamber with a special wafer type.

The invention provides a process that can be run without a wafer in the chamber to recondition the chamber following a plasma clean. The by-product deposition from Al etching has been shown to contain a large amount of organic material. The deposition is present throughout the etch process and participates in the process by providing a source of sidewall passivation, as well as recombination and adsorption sites for reactant species. The deposition can be cleaned by a plasma containing $O_2$. However this leaves some residual $O_2$ in the chamber. Further, the addition of $O_2$ to Al etching gases is known to increase the Al etch rates and can have an effect on etch profile results.

To recondition the chamber following a plasma clean, it is desirable to remove or bind the residual $O_2$ so that the etch process is not affected. It is also desirable to provide organic deposits that participate in the process the same way that by-product deposition does. In a waferless conditioning process, this must be done without attack of the wafer chuck which is not covered or protected during the process.

The preferred method for doing this is to run a plasma processing using $BCl_3$ and $CHF_3$. In an inductively coupled plasma etcher such as the TCP 9600™ etcher available from Lam Research Corporation, the process is run by applying high RF power to the top electrode (TCP™ power) source but without power applied to the bottom electrode which provides an RF substrate bias during wafer processing. This results in low plasma potential and prevents attack of the wafer chuck. $BCl_3$ is capable of scavenging residual $O_2$ from the chamber while $CHF_3$ is a source of deposition of organic materials on the chamber walls. $BCl_3$ is also a source of Cl which is present in the etch by-product deposition. Typical process conditions and ranges for a TCP 9600™ etch reactor are shown in Table 1.

TABLE 1

Process Conditions for the Waferless Recovery Process

| | Pressure | TCP ™ Power | Bias Power | $BCl_3$ | $CHF_3$ |
|---|---|---|---|---|---|
| Typical | 50 mt | 700 watts | 0 watts | 15 sccm | 37 sccm |
| Range | 10–99 | 400–1200 | 0–5 | 10–30 | 10–60 |

Depending on the Al etch stack and process requirements, a second step of the waferless recovery process may be required. If the Al etch process ends with a step that does not contain $CHF_3$, a final step of the recovery process that eliminates $CHF_3$ will improve process recovery. An example of a 2 step waferless recovery process is shown in Table 2.

TABLE 2

Two Step Waferless Recovery Process

| | Pressure | TCP ™ Power | Bias Power | $BCl_3$ | $Cl_2$ | $CHF_3$ |
|---|---|---|---|---|---|---|
| Step 1 | 50 mt | 700 Watts | 0 watts | 15 sccm | | 37 sccm |
| Step 2 | 15 mt | 450 watts | 0 watts | 30 sccm | 30 sccm | |

While $BCl_3$ was selected for it's $O_2$ scavenging capability, other gases such as $CCl_4$ and $SiCl_4$ would be suitable alternatives. The chlorine concentration could be raised by adding $Cl_2$. Likewise, many chlorocarbon, fluorocarbon and CFC gases could easily be substituted for $CHF_3$ as a polymer source. Diluent gases such as He and Ar could be added while maintaining an effective process.

The waferless recovery process can be run without special wafer types, eliminating the need for operator intervention. An additional benefit to not a: needing wafers for the recovery process is that there is minimal loss to production time as there is no overhead time used to load a wafer into the chamber for the clean or conditioning step. The direct result of this is a higher availability of the reactor for etching valuable product.

Use of the waterless recovery step following a reactor wet clean has the advantage of reducing, wet clean recovery time as well. For instance, compared to a conditioning process wherein it takes around 90 minutes to run 50 resist wafers through the wet-cleaned chamber, according to the invention the conditioning process can be completed in around 5 minutes or less. Thus, the conditioning process according to the invention can cut the recovery time following a chamber clean by over 50%, and even 80% or higher. Further, the chamber can be conditioned in less time without using or minimizing use of conditioning wafers. Increased availability of the reactor for product, and reduced non-production wafer requirements are both advantageous for increased customer profitability.

Test Data and Results, TCP™ 9600SE™ System

System Baseline

This study was started with a baseline of the 9600 SE™ system. The chamber was wet cleaned, and blanket photoresist (PR) wafers were run to condition the chamber. Aluminum etch rate wafers were run on the conditioned chamber to establish the etch rate target for the waferless recovery process development work. The process etch rate shift due to execution of a long $O_2$ waferless autoclean (WAC) was established. Etch rate results from the baseline tests are shown in Table 3.

TABLE 3

Aluminum Etch Rate Baseline Data Before and After an 8 min. $O_2$ WAC

| Wafer ID | Average Step Height | % Change Due to Clean | Pressure Control Valve Angle (% open) |
|---|---|---|---|
| Pre clean #1 | 4602 | | 36.8 |
| Pre clean #2 | 4659 | | 36.1 |
| Post WAC | 5254 | 13.5% | 35.5 |

Chamber/Process Recovery Considerations

Several mechanisms have been proposed to account for the etch rate increase following the WAC. One proposal for etch rate recovery was to use $Cl_2$ flow control rather than pressure control valve position to regulate pressure since Al etch rate scales with $Cl_2$ flow. The interaction of $Cl_2$ with clean and conditioned chamber walls will be different (adsorption, recombination, etc.), and if this affected the net $Cl_2$ concentration it is possible that this would be reflected in the chamber pressure for a fixed pressure control valve position.

The addition of small amounts of $O_2$ to some aluminum etch processes has also been reported to increase Al etch rate. Residual $O_2$ in the chamber was proposed as a possible cause of etch rate increase after WAC. A conditioning process that scavenges residual $O_2$ could address this issue.

Cycling resist wafers is a very effective method for chamber conditioning and is the recovery procedure recommended after wet clean. This points to the role of carbon in etch by-product as a significant factor in chamber conditioning. Also, the effectiveness of an $O_2$ WAC for chamber cleaning indicated that the chamber walls are conditioned with organic deposits. Use of an organic depositing chemistry for chamber conditioning could address this issue.

The proposed mechanisms were considered and a series of experiments were conducted to determine the significant effects.

For the $Cl_2$ flow control option to work, there must be a measurable difference in the pressure for a fixed pressure control valve position before and after the waferless clean. Alternatively, we would expect to see the pressure control valve open wider to maintain a set pressure after the WAC if $Cl_2$ flow control could be effective. Table 3 above shows the pressure control valve position before (2 wafers) and after WAC. The change in position is small and, if significant, in the wrong direction for $Cl_2$ flow control to be effective for etch rate recovery.

Based on this, the approach investigated for chamber recovery was to look at the feasibility of a waferless recovery step (WRS). With the proposed mechanisms in mind, 3 chemistries were investigated, namely $Cl_2/BCl_3$ ($O_2$ Scavenging), $Cl_2/CHF_3$ (organic depositing), $BCl_3/CHF_3$ (combined scavenging and depositing).

To test the possible WRS processes, the system was set up to cycle the blanket resist wafer using the baseline Al etch process with the WAC (12 seconds) and WRS process run between each wafer. The 3 WRS steps tested are shown in Table 4. For each test, 30–40 blanket resist wafers were cycled prior to running an Al etch rate test. Table 5 shows the etch rate results. For a conditioned chamber, the Al etch depth is about 4630 A. The $BCl_3/CHF_3$ process shows that it is possible to recover the desired Al etch rate following the WAC using a WRS. Assuming etch rate to be a primary indicator of process shift, the feasibility of using a WRS to recover the desired process stability following WAC looks very good.

TABLE 4

WRS Process Conditions Tested

| Parameter | $Cl_2/BCl_3$ | $Cl_2/CHF_3$ | $BCl_3/CHF_3$ |
|---|---|---|---|
| Pressure | 20 mt | 20 mt | 50 mt |
| TCP ™ | 700 W | 700 W | 700 W |
| $Cl_2$ | 162 sccm | 30 sccm | |
| $BCl_3$ | 54 sccm | | 15 sccm |
| $CHF_3$ | | 37 sccm | 37 sccm |
| Step Time | 8 sec | 15 sec | 20 sec |

TABLE 5

Etch Depth Results for the WRS Process Tests

| WRS Process | Al Etch Depth | Change From Conditioned Chamber |
|---|---|---|
| $Cl_2/BCl_3$ | 5445 A | 17.6% |
| $Cl_2/CHF_3$ | 5300 A | 14.5% |
| $BCl_3/CHF_3$ | 4671 A | 0.9% |

Waferless Clean Frequency

An important part of WAC implementation will be selecting a WAC frequency that minimizes throughput impact while maximizing effectiveness at maintaining a clean chamber. The optical emission at 703 nm was determined to be a suitable WAC endpoint indicator. The signal degrades throughout the WAC process and flattens when the chamber has been adequately cleaned.

Figure 1:
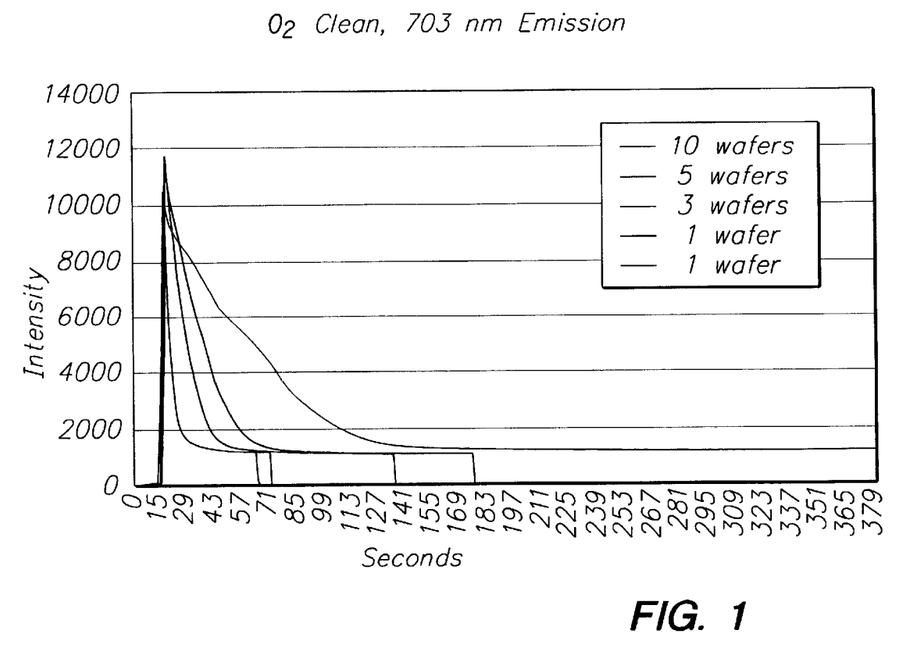
FIG. 1 shows 703 nm emission data during a waferless autoclean process in accordance with the invention.

A series of tests were run to determine how the required WAC time scales with number of wafers ("N") between WACs. The chamber was cleaned with an extended $O_2$ plasma to reach a baseline condition. This was followed by a test where the number of wafers between running the WAC was varied and the 703 nm emission was monitored during the WAC step to determine the time required to clean the chamber. FIG. 1 shows the endpoint traces from this test. The endpoint signal increases rapidly when RF comes on. As "N" increases, the length of time it takes for the endpoint signal to degrade to the baseline increases, showing the clean time is a function of "N".

Table 6 shows the endpoint time for the WAC vs. "N" as well as the clean time for wafer. Times are shown for the endpoint signal to degrade to baseline as well as degrading to 100 counts above baseline. For these process conditions the unit clean time diminishes as "N" increases from 1–5, however at "N"=10, the unit cleaning time is increasing. This suggests that an optimal clean frequency might be somewhere between 5–20 wafers.

TABLE 6

| WAC Time | 10 wafers | 5 wafers | 3 wafers | 1 wafer | 1 wafer |
|---|---|---|---|---|---|
| WAC Endpoint and Unit Clean Time (seconds) vs. WAC Frequency | | | | | |
| Full WAC | 265 | 71 | 56 | 37 | 38 |
| Emission 1 = 100 | 143 | 45 | 40 | 23 | 24 |
| Unit Clean Time | | | | | |
| Full WAC | 26.5 | 14.2 | 18.66667 | 37 | 38 |
| Emission 1 = 100 | 14.3 | 11.4 | 13.33333 | 23 | 24 |

WRS Etch Rate Recovery

Figure 4A:
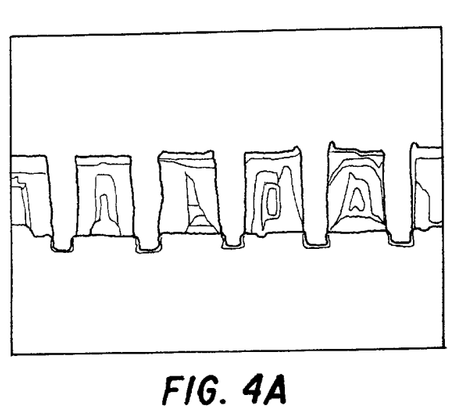
FIGS. 4a, 4b, 4c, 4d are photomicrographs of etched structures after waterless autoclean process and waferless recovery steps in accordance with the invention
Figure 4B:
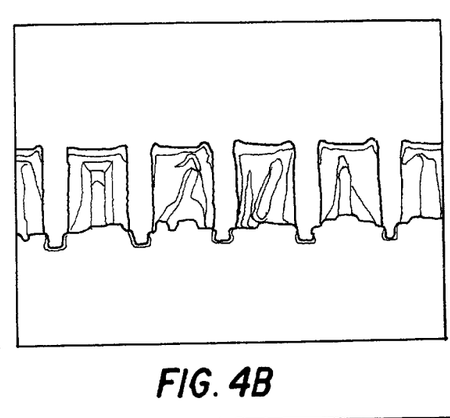
Figure 4C:
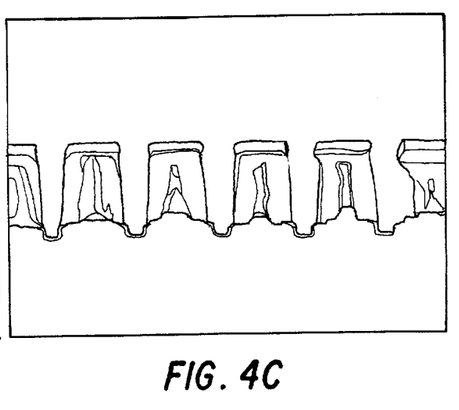
Figure 4D:
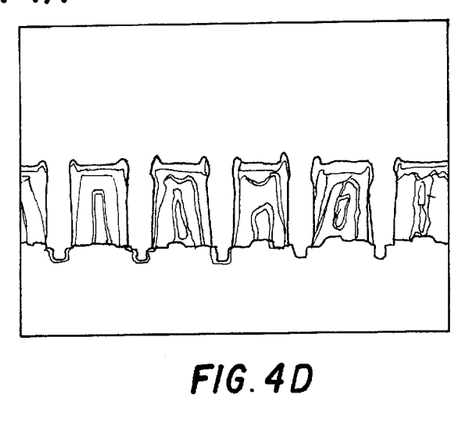
Figure 4E:
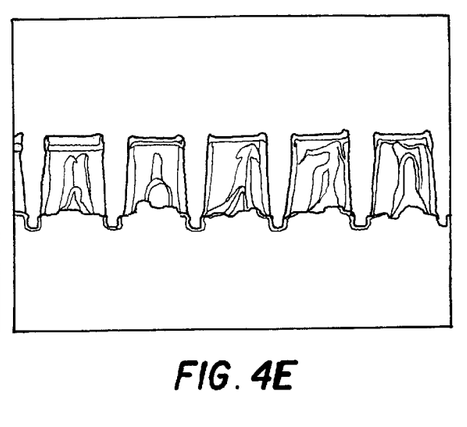
FIG. 4e is a photomicrograph of an etched structure processed in a chamber conditioned with resist wafers.

The $BCl_3/CHF_3$ WRS was tested on the 9600PTX™ system using the process conditions for the Al etch, WAC, and WRS steps shown in Table 7. The system was initially conditioned by cycling 57 blanket resist wafers with the Al etch process conditions. The Al etch rate for the conditioned chamber was measured. Following this the chamber was over cleaned using the WAC process conditions with a 7 minute clean time. The 703 nm endpoint signal was used to verify the clean time was sufficient. Next, 29 additional blanket resist wafers were cycled through the system using the Al etch process, but the WAC and WRS steps were used between each wafer. The Al etch rate was then checked again following a WAC and WRS step. The etch depth results are shown in Table 8. The etch rate following the WAC and WRS was not significantly different than the etch rate of the seasoned chamber (1.6% lower).

step 1 was run for 30, 20, 20 and 30 seconds respectively, step 2 was run for 15, 15, 7 and 7 seconds respectively, the $BCl_3$ flow rate was 15, 30, 15 and 30 sccm respectively, the $Cl_2$ flow rate was 45, 30, 45 and 30 sccm respectively and the $RO_x$ was 7154, 7227, 7576 and 7593 Angstroms respectively, FIG. 4E is a photomicrograph taken from a center location of wafer 13 etched in a conditioned chamber wherein $RO_x$ was 7506 Angstroms. FIGS. 5A, 5B, 5C and 5D are photomicrographs taken from edge locations of wafers 16, 18, 17 and 19, respectively wherein step 1 was run for 30, 20, 20 and 30 seconds respectively, step 2 was run for 15, 15, 7 and 7 seconds respectively, the $BCl_3$ flow

TABLE 7

Al Etch, WAC, and WRS Process Conditions

| Process | Pressure | TCP ™ (W) | Bias (W) | Flows (sccm) | | | He Cooling | Time (S) |
|---|---|---|---|---|---|---|---|---|
| Cycle | 12 mt | 350 | 78 | 74 $Cl_2$ | 30 $BCl_3$ | 5 $CHF_3$ | 10 T | 65 |
| Al Etch Depth | 12 mt | 350 | 78 | 74 $Cl_2$ | 30 $BCl_3$ | 5 $CHF_3$ | 10 T | 35 |
| WAC | 32 mt | 700 | 0 | 500 $O_2$ | | | | 12 |
| WRS | 50 mt | 700 | 0 | | 15 $BCl_3$ | 37 $CHF_3$ | | 20 |

TABLE 8

Al Etch Depth of the Conditioned Chamber and Following the WAC + WRS Process

| Test Condition | Al Etch Depth | Delta |
|---|---|---|
| Conditioned Chamber | 3835 | |
| Post WAC + WRS | 3773 | ~1.6% |

Profile Etch Tests

Figure 2:
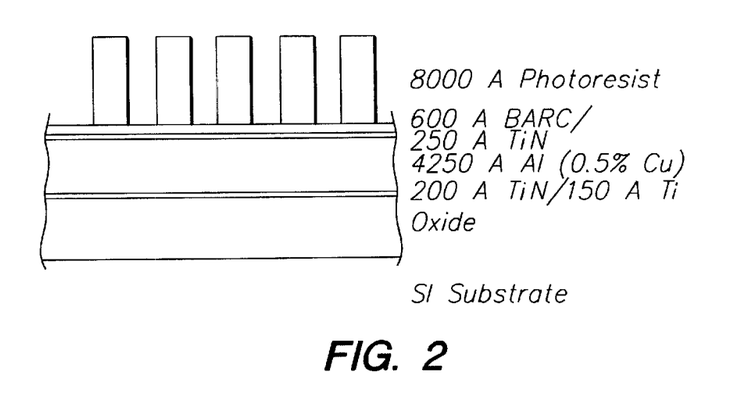
FIG. 2 depicts a pre-etch structure of 0.25 µm profile test wafers.

Etch tests were performed to determine the effect of the WAC and WRS on etch profile. FIG. 2 illustrates the profile test wafer structure before etching.

Figure 3:
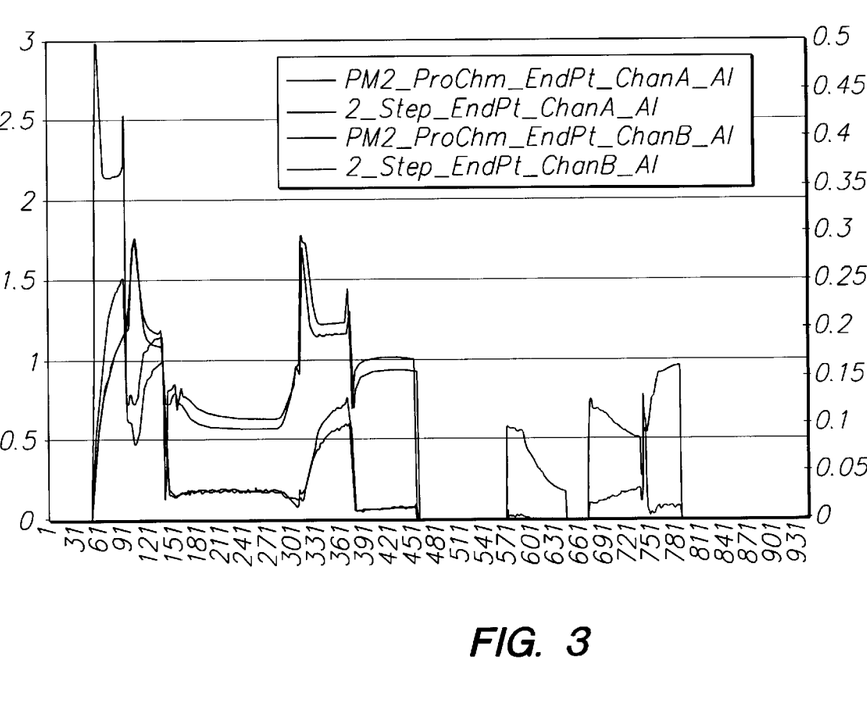
FIG. 3 is a comparison of profile wafer endpoint traces following chamber conditioning with resist wafers and following the waferless autoclean process in accordance with the invention.
Figure 5A:
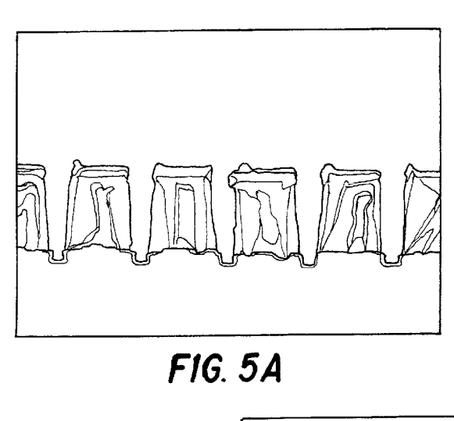
FIGS. 5a, 5b, 5c, 5d are photomicrographs of etched structures after waterless autoclean process and waferless recovery steps in accordance with the invention
Figure 5B:
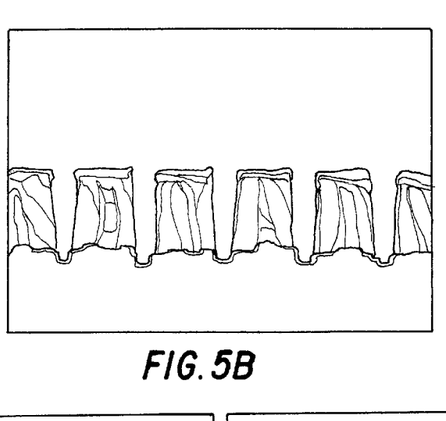
Figure 5C:
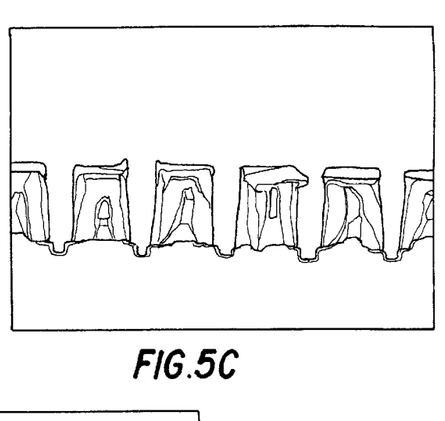
Figure 5D:
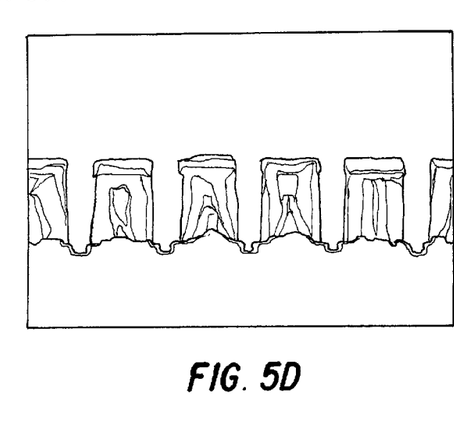
Figure 5E:
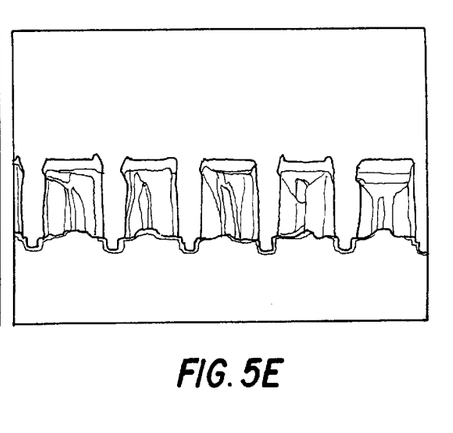
FIG. 5e is a photomicrograph of an etched structure processed in a chamber conditioned with resist wafers.

A small matrix was run to evaluate the importance of step time and $BCl_3:Cl_2$ ratio in the recovery step on etch profile. Table 9 shows the 4 processes run in a ½ factorial matrix. FIG. 3 shows the endpoint trace for a wafer etched following the 2 step recovery process. The endpoint trace closely matches the trace of a wafer etched in a resist conditioned chamber. Further, the etch rates through the BARC, Ti and TiN layers match the etch rates of such layers in the resist conditioned chamber. All wafers etched following the 2 step recovery had similar traces.

rate was 15, 30 15 and 30 sccm respectively, the $Cl_2$ flow rate was 45, 30, 45 and 30 sccm respectively and the $RO_x$ was 7154, 7227, 7576 and 7593 Angstroms respectively. FIG. 5E is a photomicrograph taken from an edge location of wafer 13 etched in a conditioned chamber wherein $RO_x$ was 7506 Angstroms. The differences in etch profile between the wafers is subtle in most cases showing that the 2 step recovery process has a reasonable process window. Some notable trends from the matrix include:

A chlorine base second recovery step improves the etch profile recovery.

Use of a higher % $Cl_2$ in the second recovery step appears to result in reduced CD growth in the feature top compared to the reference wafer.

The effect is stronger for a short first recovery step time (see wafer 17).

Use of the longer first recovery step improves process latitude for sidewall smoothness.

Wafers etched with the shorter second step times more closely matched the remaining oxide on the reference wafer.

Figure 6A:
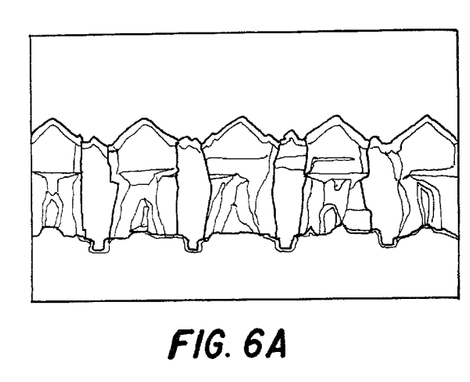
FIGS. 6a, 6b, and 6c are photomicrographs of etched structures after waterless autoclean process and waferless recovery steps in accordance with the invention

FIGS. 6A-F show additional SEMs comparing the result of wafer 19 to the conditioned chamber result. FIG. 6A

TABLE 9

Baseline Process:
Step 1: 50 mt/700 W TCP ™/37 sccm $CHF_3$/15 sccm $BCl_3$/"X" seconds
Step 2: 15 mt/450 W TCP ™/"Y". sccm $BCl_3$/(60-"Y") sccm $Cl_2$/"Z" seconds

| Matrix | Wafer 16 | Wafer 17 | Wafer 18 | Wafer 19 |
|---|---|---|---|---|
| Step 1 Time ("X") | 30 sec | 20 sec | 20 sec | 30 sec |
| Step 2 Time ("Z") | 15 sec | 7 sec | 15 sec | 7 sec |
| $BCl_3/Cl_2$ Flows ("Y")/(60-"Y") | 15 sccm $BCl_3$ 45 sccm $Cl_2$ | 15 sccm $BCl_3$ 45 sccm $Cl_2$ | 30 sccm $BCl_3$ 30 sccm $Cl_2$ | 20 sccm $BCl_3$ 30 sccm $Cl_2$ |

Figure 6B:
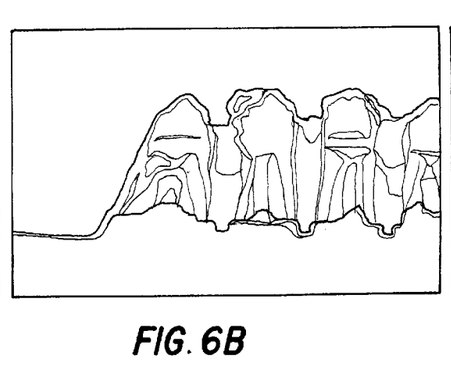
Figure 6C:
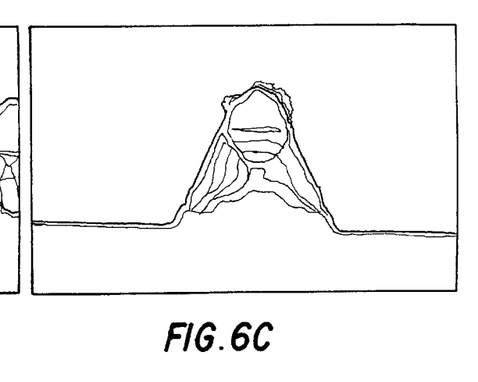
Figure 6D:
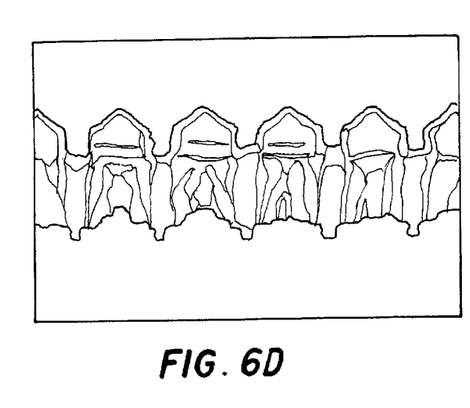
FIGS. 6d, 6e, and 6f are photoinicrographs of etched structures processed in a chamber conditioned with resist wafers.
Figure 6E:
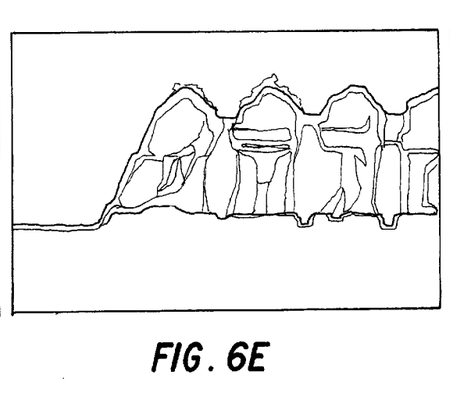
Figure 6F:
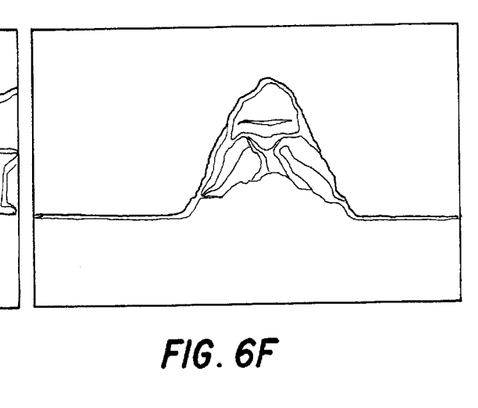

FIGS. 4A-E and 5A-E show the etch profiles from wafers etched as part of the WAC and WRS matrix compared to the result of etching in a resist conditioned chamber. FIGS. 4A, 4B, 4C and 4D are photomicrographs taken from center locations of wafers 16, 18, 17 and 19, respectively wherein shows a center location, FIG. 6B shows an edge location, FIG. 6C shows an edge location. FIG. 6D shows a center location, FIG. 6E shows an edge location, and FIG. 6F shows an edge location. Note in these SEMs the profile of isolated features is also reproduced, and the resist profile and sidewall deposition are matched by the 2 step recovery process as well.

It appears that running the first recovery step long enough to generate some organic film in the chamber, followed by running a brief chlorine chemistry is sufficient to recover the process after the WAC. The chlorine chemistry step may not be necessary for processes that rely on heavy organic deposition and high bombardment energies to protect the etch sidewall.

Process recovery for etching aluminum after WAC requires that a proper balance be achieved between organic deposition in the chamber and chlorination of the chamber walls. Process recovery for the $CHF_3$ additive etch process where the etch profile is more sensitive to chemistry balance has been demonstrated. The WRS matrix shows that a 2 step recovery process can be tuned to balance the organic and chlorinated composition in the chamber to a "conditioned" state following the WAC.

While the invention has been described in detail with reference to specific embodiments thereof, it will be apparent to those skilled in the art that various changes and modifications can be made, and equivalents employed, without departing from the scope of the appended claims.

What is claimed is:

1. A method of cleaning and conditioning a plasma reaction chamber in which substrates are processed, comprising the steps of:
   cleaning the plasma reaction chamber so as to remove deposits built up on surfaces within the chamber;
   conditioning the chamber by introducing a conditioning gas comprising a fluorine-containing gas and a carbon-containing gas into the chamber, energizing the conditioning gas into a plasma and, depositing a polymer coating formed by the plasma on interior surfaces of the chamber, the conditioning step being carried out while the chamber does not contain a substrate therein; and
   processing a substrate in the chamber after the conditioning step.

2. The method of claim 1, wherein the energizing step is carried out by exposing the conditioning gas to an inductive field generated by resonating a radio frequency current in an RF antenna coil, the RF antenna coil being disposed external to the chamber, proximate to a dielectric shield which forms a part of an enclosure of the chamber.

3. The method of claim 2, wherein the RF antenna is supplied 200 to 1000 Watts during the conditioning step.

4. The method of claim 1, wherein the conditioning gas further comprises a chlorine-containing gas and the polymer deposited in the depositing step includes chlorine therein.

5. The method of claim 1, wherein the cleaning step is carried out by opening the chamber and performing a wet clean.

6. The method of claim 1, wherein the cleaning step is carried out by introducing a cleaning gas into the chamber, energizing the cleaning gas into a plasma state, and contacting the interior surfaces with the plasma to remove the deposits.

7. The method of claim 5, wherein the plasma cleaning gas converts the deposits on the interior surfaces to gas by-products.

8. The method of claim 1, wherein the substrate comprises a production wafer and the processing step is carried out without processing conditioning wafers in the chamber prior to processing the production wafer.

9. The method of claim 1, wherein the processing step comprises etching an aluminum film stack on the production wafer.

10. The method of claim 1, wherein the conditioning step is carried out without applying power to an RF biasing electrode of a substrate support on which the substrate is supported during the processing step.

11. The method of claim 1, wherein the conditioning gas includes $Cl_2$, $BCl_3$, $CCl_4$, $SiCl_4$ or mixture thereof.

12. The method of claim 1, wherein the conditioning gas includes $CHF_3$ and $BCl_3$ and/or $Cl_2$.

13. The method of claim 1, wherein the chamber pressure during the conditioning step is in the range of from about 5 to 80 mTorr.

14. The method of claim 1, wherein the chamber is a plasma etch chamber.

15. The method of claim 14, further comprising a step of etching aluminum on one or more semiconductor substrates in the chamber prior to the cleaning step, the etching step producing the deposits on the interior surfaces of the chamber.

16. The method of claim 14, wherein the conditioning step is followed by introducing one or more semiconductor substrates into the chamber and etching aluminum on the one or more substrates.

17. The method of claim 1, wherein the conditioning step is performed until an endpoint determined by optical emission or interferometry is reached.

18. The method of claim 1, wherein the conditioning step is carried out in first and second steps, the conditioning gas further including a chlorine-containing gas in the first step and the conditioning gas being fluorine-free in the second step.

19. The method of claim 18, wherein the conditioning gas comprises 1–30 sccm $BCl_3$ and 10–60 sccm $CHF_3$ in the first step and the conditioning gas comprises 20–60 sccm $BCl_3$ and 20–60 sccm $Cl_2$ in the second step.

20. The method of claim 1, wherein residual oxygen in the plasma reaction chamber is scavenged by the plasma formed from the conditioning gas.

21. The method of claim 1, wherein an etch rate of a first substrate processed according to an etch recipe in the plasma reaction chamber prior to the cleaning step and an etch rate of a second substrate processed according to the etch recipe in the plasma reaction chamber after the depositing step are substantially equal etch rates.

* * * * *

UNITED STATES PATENT AND TRADEMARK OFFICE
CERTIFICATE OF CORRECTION

PATENT NO. : 6,350,697 B1  Page 1 of 1
DATED : February 26, 2002
INVENTOR(S) : Brett C. Richardson et al.

It is certified that error appears in the above-identified patent and that said Letters Patent is hereby corrected as shown below:

Column 1,
Line 20, delete "waterless" and insert therefor -- waferless --;
Line 44, delete "wafers season" and insert therefor -- wafers to season --;

Column 2,
Line 18, delete "plasmastate" and insert therefor -- plasma state --;
Line 47, delete "$CCl_4SiCl_4$" and insert therefor -- $CCl_4$, $SiCl_4$ --;

Column 3,
Line 56, delete "processing" and insert therefor -- process --;

Column 4,
Line 30, delete "adding $Cl_2$ Likewise" and insert therefor -- adding $Cl_2$. Likewise --;
Line 36, delete "to not a: needing" and insert therefor -- to not needing --;
Line 44, delete "reducing, wet" and insert therefor -- reducing wet --;

Column 6,
Line 43, delete "time for wafer" and insert therefor -- time per wafer --;

Column 8,
Line 35, delete "chlorine base second recovery" and insert therefor -- chlorine based second recovery --.; and Column 10,
Line 1, delete "The method of claim 5" and insert therefor -- The method of claim 6 --.

Signed and Sealed this

Sixth Day of August, 2002

Attest:

Attesting Officer

JAMES E. ROGAN
Director of the United States Patent and Trademark Office